United States Patent [19]

Blass

[11] 3,757,303

[45] Sept. 4, 1973

[54] REMOTE CONTROL SYSTEM

[75] Inventor: David A. Blass, Elmwood Park, Ill.

[73] Assignee: Zenith Radio Corporation, Chicago, Ill.

[22] Filed: Apr. 19, 1972

[21] Appl. No.: 245,354

[52] U.S. Cl. .................. 340/148, 325/392, 328/140, 340/171 R

[51] Int. Cl. .................................................. H04q 9/00

[58] Field of Search .......................... 340/148, 171 R; 325/392; 307/233; 328/140, 146, 149

[56] References Cited

UNITED STATES PATENTS

| | | | |
|---|---|---|---|
| 3,701,103 | 10/1972 | Padgett et al. | 340/171 X |
| 3,558,924 | 1/1971 | Lindell | 328/147 X |
| 3,555,435 | 1/1971 | Vosteen | 328/140 |
| 3,371,225 | 2/1968 | Featherston | 328/140 X |
| 3,535,658 | 10/1970 | Webb | 328/140 |
| 3,529,247 | 9/1970 | Nelson | 328/140 |

*Primary Examiner*—Donald J. Yusko
*Attorney*—John H. Coult

[57] ABSTRACT

A wireless remote control system for effecting a plurality of control functions to a television receiver or the like from a remote location utilizes a hand-held transmitter for generating an ultrasonic pressure wave signal at discrete function-indicative frequencies. Upon reception, the signal is converted to a series of constant-width constant-amplitude rectangular pulses by a monostable multivibrator circuit, and thence to a dc control voltage by a digital-to-analog converter circuit. A plurality of voltage-comparator elements, each corresponding to a selected one of the adjustment-functions, compares the dc control voltage to predetermined pre-set voltage levels to determine which of the adjustments is to be performed.

9 Claims, 4 Drawing Figures

REMOTE CONTROL SYSTEM

BACKGROUND OF THE INVENTION

The present invention relates to remote control systems, and more particularly to an improved multi-function remote control system for a television receiver or the like.

Ultrasonic remote control systems have for years been a popular control medium for television receivers. Such systems, which typically consist of a hand-held viewer-actuable transmitter for producing ultrasonic signals at multiple discrete frequencies, and a remote control receiver adjacent the television receiver chassis for receiving and decoding the multiple-frequency ultrasonic signals, have provided generally satisfactory performance. However, one problem heretofore associated with the receivers in such systems has been the need for multiple tuned circuits for decoding each of the ultrasonic control signal frequencies and for providing immunity against noise and other non-valid signals. With the stability problems and need for alignment attendant such tuned circuits, the cost of ultrasonic control systems has been unnecessarily increased and long-term stability has been unnecessarily impaired. Thus, the need has developed for an ultrasonic remote control system suitable for controlling a television receiver which does not require tuned circuits for decoding the received ultrasonic control signals.

SUMMARY OF THE INVENTION

Accordingly, it is an object of the present invention to provide a new and improved ultrasonic remote control system for a television receiver or the like.

It is a more specific object of the invention to provide an improved ultrasonic remote control system which does not require the use of tuned circuits for processing and decoding received control signals.

It is a still more specific object of the invention to provide an ultrasonic remote control system which is more economical to construct and which does not require the adjustment of multiple tuned circuits.

In accordance with the invention, a remote control system for initiating a control function in an apparatus from a remote location comprises: a remotely located transmitter for generating a wave signal at a predetermined discrete frequency and receiving means for intercepting the wave signal and developing a corresponding electrical control signal at a voltage level indicative of the frequency of the wave signal, the control signal having a predetermined voltage level during reception of wave signals at the predetermined frequency.

Control signal recognition means are provided for producing a control effect only when the control signal is at the predetermined voltage level, and utilization means responsive to the control effect are provided for performing the control function during reception of wave signals at the predetermined frequency.

BRIEF DESCRIPTION OF THE DRAWINGS

The features of the present invention which are believed to be novel are set forth with particularity in the appended claims. The invention together with the further objects and advantages thereof may best be understood by reference to the following description taken in conjunction with the accompanying drawings and in which:

DESCRIPTION OF THE PREFERRED EMBODIMENT

Figures 1, 2:
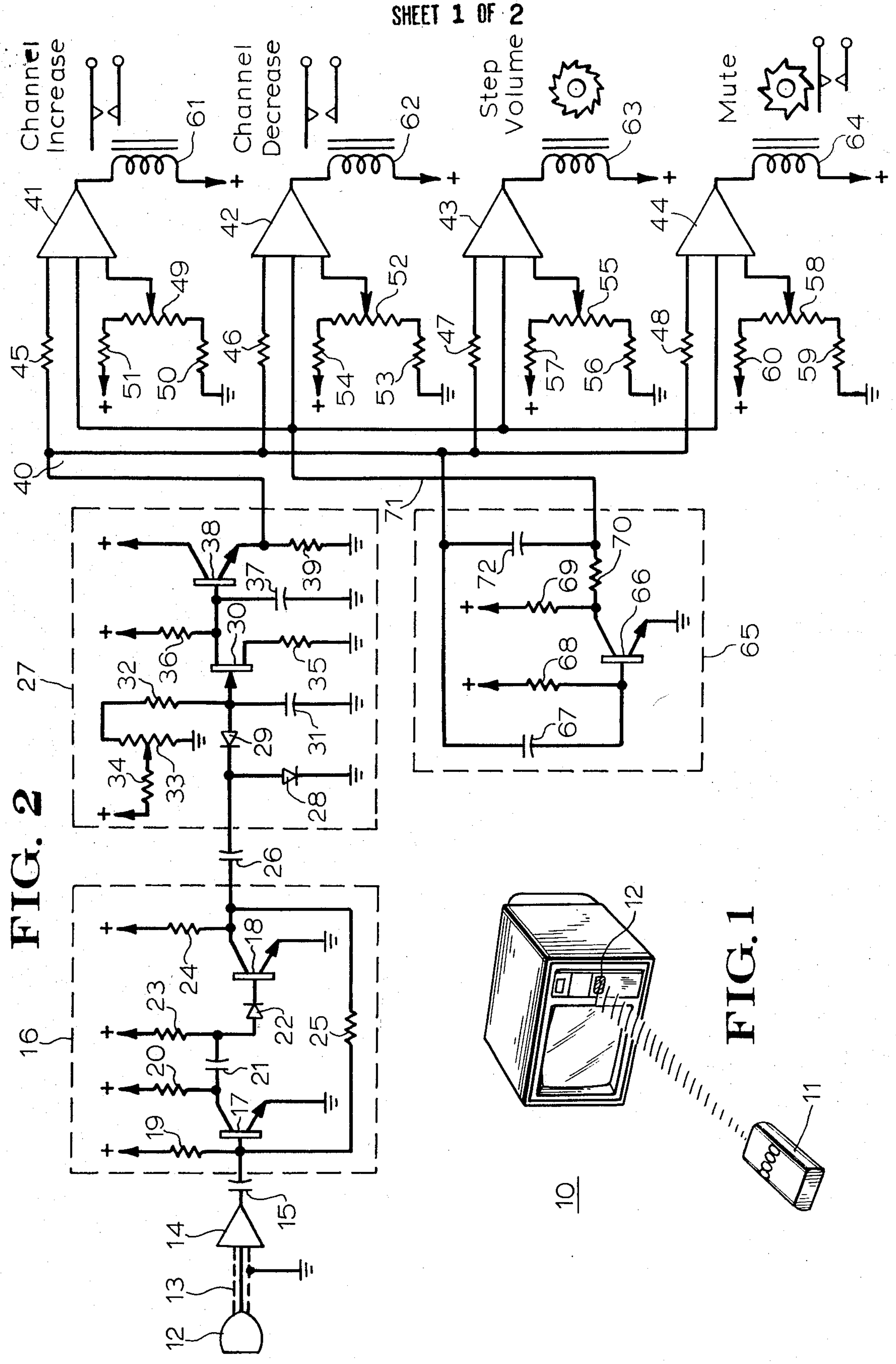
FIG. 1 is a perspective view of a television receiver incorporating an ultrasonic remote control system constructed in accordance with the invention.
FIG. 2 is a schematic diagram, partially in block form, of an ultrasonic remote control system embodying the present invention.

Referring to FIG. 1, the remote control system of the invention is seen to be incorporated as an ultrasonic control system in a conventional television receiver 10, which may be either monochrome or color. The system comprises a hand-held remotely located transmitter 11 which contains four control buttons for controlling the generation of ultrasonic pressure wave command signals at four respective discrete frequencies. A microphone 12 contained within the escutcheon of the television receiver converts the received ultrasonic pressure waves to like-frequency electrical signals for subsequent amplification and processing in the control system receiver, which is contained within receiver 10 but which does not appear in FIG. 1.

Referring now to FIG. 2, the output signal from microphone 12 is coupled by a shielded cable 13 to the input of a voltage amplifier 14. This amplifier, which preferably comprises a conventional IC amplifier adapted to provide a 5 kHz wide bandpass characteristic centered at 40 kHz, amplifies the applied signal from microphone 12. The output of amplifier 14 is coupled by a capacitor 15 to receiving means which include a monostable multivibrator stage 16, which comprises a pair of NPN transistors 17 and 18 connected in a multivibrator circuit configuration. The emitter of transistor 17 is grounded, and the base is connected by a resistor 19 to the receiver B+ source. The collector is connected by a load resistor 20 to B+ and by a capacitor 21 to the anode of a diode 22. The anode of diode 22 is also connected to B+ by a resistor 23 and the cathode is connected to the base of transistor 18. The emitter of transistor 18 is grounded and the collector is connected to B+ by a collector load resistor 24 and to the base of transistor 17 by a feed-back resistor 25.

The output of multivibrator stage 16, derived at the collector of transistor 18, is coupled by a capacitor 26 to a digital-to-analog converter stage 27, which also comprises part of the receiving means of the system. Therein, the multivibrator output is applied to the anode of a diode 28 and to the cathode of a diode 29. The cathode of diode 28 is connected to ground and the anode of diode 29 is connected to the gate electrode of an N channel depletion-mode field effect transistor (FET) 30. The gate of FET 30 is connected by a capacitor 31 to ground and by a resistor 32 to one end terminal of a potentiometer 33. The other end terminal of the potentiometer is connected to ground and the arm is connected by a fixed resistor 34 to the receiver B+ source. The drain electrode of FET 30 is connected to ground by a resistor 35 and the source electrode is connected to B+ by a resistor 36, to ground by a capacitor 37, and to the base of an NPN transistor 38. The collector of transistor 38 is connected directly to B+ and the emitter is connected to ground by a resistor 39.

The output of digital-to-analog converter 27, a dc control signal, appears at the emitter of transistor 38 and is coupled by a control line 40 to control signal recognition means in the form of four voltage comparator amplifiers 41–44 by respective ones of series isolation resistors 45–48. Voltage comparators 41–44, available commercially as the Motorola MC 1335 tuning indicator, comprise a form of differential amplifier which produces an output only when signals having substantially equal voltage levels are impressed on each of its two input terminals. The control signal is applied to one input terminal of each voltage comparator, and the remaining input terminal of each is connected to an adjustable source of reference potential, a three element resistive voltage divider. Specifically, the remaining input terminal of voltage comparator 41 is connected to the arm of a potentiometer 49, one end terminal of which is connected to ground through a resistor 50 and the other end terminal of which is connected to B+ by a resistor 51. Similarly, the remaining input terminal of voltage comparator amplifier 42 is connected to the arm of a potentiometer 52, one end terminal of which is connected to ground through a resistor 53 and the other end terminal of which is connected to B+ by a resistor 54. The remaining input terminal of voltage comparator 43 is connected to the arm of a potentiometer 55, one end terminal of which is connected to ground by a resistor 56 and the other end terminal of which is connected to B+ by a resistor 57. The remaining input temrinal of voltage comparator 44 is connected to the arm of a potentiometer 58, one end terminal of which is connected to ground by a resistor 59 and the other end terminal of which is connected to B+ by a resistor 60.

Voltage comparators 41–44 each further include an inhibit terminal which, when impressed with a positive polarity voltage, prevents the voltage comparator from generating an output. As will be seen, this terminal is necessary to prevent the comparators from responding to the progressively variable control signals which ordinarily occur upon initial receipt of a new command signal.

The output terminals of voltage comparators 41–44 are connected to utilization means for accomplishing the particular control function associated with each comparator. In particular, the output of voltage comparator 41, a positive-polarity current source present only during receipt of a command for the television receiver tuner to increase channels, is connected to B+ through the coil of a relay 61. Similarly, the output of voltage comparator 42, corresponding to a command for the receiver tuner to decrease channels, is connected to B+ through the coil of a relay 62. The contacts associated with relays 61 and 62 may each be single-pole single-throw contacts of sufficient capacity to power a bi-directional tuner drive motor. The output of voltage comparator 43, which corresponds to a command to change the volume level of the television receiver, is connected to B+ through the actuating coil of a multiple-position stepper relay 63. This relay preferably cyclically steps through multiple of switch positions, each position introducing a different degree of audio attenuation to achieve multiple discrete volume levels. Finally, voltage comparator 44, which corresponds to an audio mute command, is connected to B+ by means of a bi-stable switch device 64 which provides a contact closure on alternate commands to alternately enable and disable the audio from the receiver.

To prevent voltage comparators 61–64 from falsely responding to the progressively variable voltage on control line 40 which occurs while the function-indicative voltage output of digital-to-analog discriminator 27 is changing in response to a new command, the receiver includes an inhibit stage 65. This stage comprises an NPN transistor 66 having its base connected to control line 40 by a capacitor 67 and to B+ by a resistor 68. The emitter of transistor 66 is grounded and the collector is connected to B+ by a resistor 69. The collector is also connected by a series resistor 70 to an inhibit control line 71, which is connected directly to the inhibit terminals of the four voltage comparators 41–44. Control line 71 is connected to control line 40 within inhibit stage 65 by a capacitor 72.

In operation, an ultrasonic pressure-wave from transmitter 11 is received on one of the four discrete function-indicative signal frequencies by microphone 12. The pressure wave is converted to an electrical signal by the microphone, amplified by amplifier 14 and applied through capacitor 15 to the base of transistor 17. Although transistor 17 is normally biased to cutoff, the applied signal is of sufficient amplitude to drive it into saturation. This causes capacitor 21, normally fully charged by resistor 20, to discharge through resistor 23, and in so doing to back-bias the emitter-base junction of transistor 18. This cuts-off normally saturated transistor 18, and the resulting voltage increase at its collector is coupled by feedback resistor 25 back to the base of transistor 17 to maintain that device in saturation.

As long as the discharge current from capacitor 21 is sufficient to maintain transistor 18 cut-off, transistor 17 is held in saturation. However, when the discharge current falls to the point where transistor 18 begins to conduct, the feedback voltage through resistor 25 falls and transistor 17 ceases to conduct (assuming that no positive-polarity signal is then present on its base). Once transistor 17 cuts off, the voltage level at the collector of transistor 17 increases and capacitor 21 quickly recharges through resistor 20. Thus, for each positive-polarity half-cycle signal applied to the base of transistor 17, transistor 18 is cut-off for a predetermined period of time. This produces a series of constant-width constant-amplitude pulses at the collector of transistor 18 at a repetition rate dependent on the frequency of the received pressure wave. This signal format is highly advantageous for reasons which will presently become apparent.

The constant-width pulses from multivibrator 16 are coupled by capacitor 26 to the digital-to-analog converter stage 27. There, capacitor 26 rapidly charges and discharges with alternate half-cycles of the applied square-wave signal, charging through diode 28 during positive half-cycles when transistor 18 is cut-off, and discharging through diode 29 and resistors 32, 33 and 34 during negative half-cycles when transistor 18 is saturated. The rate of discharge of capacitor 26 is dependent on the effective series resistance presented by resistors 32, 33 and 34, which in turn is dependent on the adjustment of potentiometer 33. As capacitor 26 periodically charges and discharges, an average voltage dependent on the frequency of the charge-discharge cycle is developed across capacitor 31. FET 30, because of its high gate impedance, has virtually no effect on the capacitor, but does serve to amplify the frequency-indicative voltage, developing an amplified output voltage across its drain electrode load resistor 35. This voltage is filtered by capacitor 37 and applied through an emitter-follower connected NPN transistor 66 to control line 40 as a dc control voltage indicative of the frequency of the received ultrasonic pressure wave.

It is at this point that the advantages of utilizing a monostable mutlivibrator followed by a digital-to-analog converter are realized. By maintaining the pulses generated by monostable multivibrator 16 at a predetermined constant width such that if the frequency of the incoming ultrasonic pressure wave signal exceeds that of the highest assigned command signal the pulses run togehter, the remote control receiver achieves an immunity against extraneous ultrasonic noise heretofore attainable only with high Q tuned circuits. Specifically, the run-together pulses comprise a non-pulsating input to digital-to-analog converter 27 which causes the voltage on capacitor 31 to become that developed across diodes 28 and 29 as a result of B+ current through resistors 32 and 34 and potentiometer 33. This voltage, when amplified by FET 30, results in a control voltage on control line 40 far removed from the predetermined voltage sensing levels of voltage comparators 41–44. This can be seen in FIG. 3, which is a plot of control line voltage as a function of the frequency of the intercepted wave signal. There it is seen that the voltage rises linearly from a nominal no input value with increasing frequencies $f_1$–$f_4$, and falls abruptly back to the nominal value as the pulses run togehter. In practice, the frequencies $f_1$–$f_4$ range from 37.75 kHz to 41.25 kHz, and produce control signals ranging from 2 volts to 7 volts above a nominal no-signal voltage of 0.5 volts.

A degree of protection against extraneous ultrasonic signals falling below that of the lowest frequency command signal is obtained through the proper choice of capacitor 31 and resistor 32. Specifically, by making the time constant of this combination sufficiently short low-frequency signals with widely spaced pulses have little effect on the dc voltage level developed on capacitor 31, and hence on the control voltage ultimately appearing on control line 40.

As has been mentioned previously, each of the four discrete-frequency pressure waves generated by transmitter 11 is associated with the performance of a control function within the television receiver. In each case the discrete-frequency pressure waves are received by microphone 12, converted to a series of constant-width rectangular pulses by multivibrator 16, and converted to a discrete frequency-indicative dc control voltage by digital-to-analog converter 27. This control voltage is coupled by control line 40 to the first input of each of voltage comparators 41–44 through individual series connected isolation resistors 45–48, respectively. Voltage comparators 41–44 can be set to respond to any one of the four ultrasonic command signals by applying to its remaining input terminal a dc voltage substantially identical to that developed on control line 40 during reception of the desired command. For instance, to cause voltage comparator 41 to respond to receipt of a channel increase command, i.e. the first of the four control functions, it is necessary to apply a dc voltage to its remaining input substantially identical to the voltage developed on control line 40 during receipt of the ultrasonic pressure wave corresponding to that command. In the present embodiment this is accomplished by means of a voltage divider comprising potentiometer 49 and resistors 50–51, the position of the arm on potentiometer 49 determining the exact reference voltage applied to the voltage comparator. When the two input voltage levels agree an output is produced by voltage comparator 41 which energizes relay 61 and applies power to the associated actuator through appropriate circuitry. In practice, potentiometer 49 is adjusted to agree with the voltage developed on control line 40 by the channel-increase function, and the contacts of relay 61 are connected to a bi-directional motor drive which rotates the tuner shaft towards progressively increasing channels.

Similarly, potentiometer 52 is adjusted so that voltage comparator 42 will actuate relay 62 in the presence of a control voltage on control line 40 representative of a command to decrease the viewing channel. In this case the bi-directional tuner motor drive is connected to the contacts of relay 62 so as to rotate the tuner towards progressively decreasing channels upon closure of the contacts. Potentiometer 55 is adjusted so that voltage comparator 43 will actuate volume stepper relay 63 when the voltage on control line 40 indicates reception of a step-volume command. A multiple-position rotary attenuator is coupled to the relay cam wheel to accomplish the actual volume change. Potentiometer 58 is adjusted to cause volume comparator 44 to actuate bi-stable relay 64 in the presence of a mute-audio command-representative voltage on control line 40. In its simplest form this relay may comprise a set of single-pole single-throw contacts which alternately short to ground or otherwise disable a portion of the television receiver audio channel.

While relays have been shown in the output circuits of voltage comparators 41–44, it will be appreciated that their solid state counterparts, such as SCR's or Triac's, could be used instead. Furthermore, it is contemplated that in electronically tuned or so-called varactor tuners it would be possible to utilize the output of the voltage comparators to control electronic ramp function generators, digital counters, or other scanning circuits directly without intervening relays or other electro-mechanical devices.

Inhibit stage 65 prevents the voltage comparators from producing an output while the voltage on control line 40 is progressively variable, i.e., increasing or decreasing in response to a new pulse rate. In the case of an increasing voltage on control line 40, the inhibit circuit functions by utilizing the increasing voltage to charge capacitor 72 through transistor 66, which is normally biased into saturation by resistor 68. The resulting current flow from capacitor 72 to the collector of resistor 70 develops a positive voltage across resistor 70, and this voltage is applied via control line 71 to the inhibit input terminals of voltage comparators 41–44 to prevent these devices from responding to the changing control voltage on control line 40.

In the case of a decreasing control voltage, capacitor 67 discharges through the emitter-base junction of transistor 66, interrupting conduction in the collector circuit of that device. This raises the collector of transistor 66, and hence control line 71, to a sufficiently positive value to inhibit voltage comparators 41–44. Thus, both positive and negative excursions in the control voltage on control line 40 are rendered ineffective as to voltage comparators 41–44, thereby assuring that only steady state voltage conditions will initiate the four control functions.

Figures 3, 4:
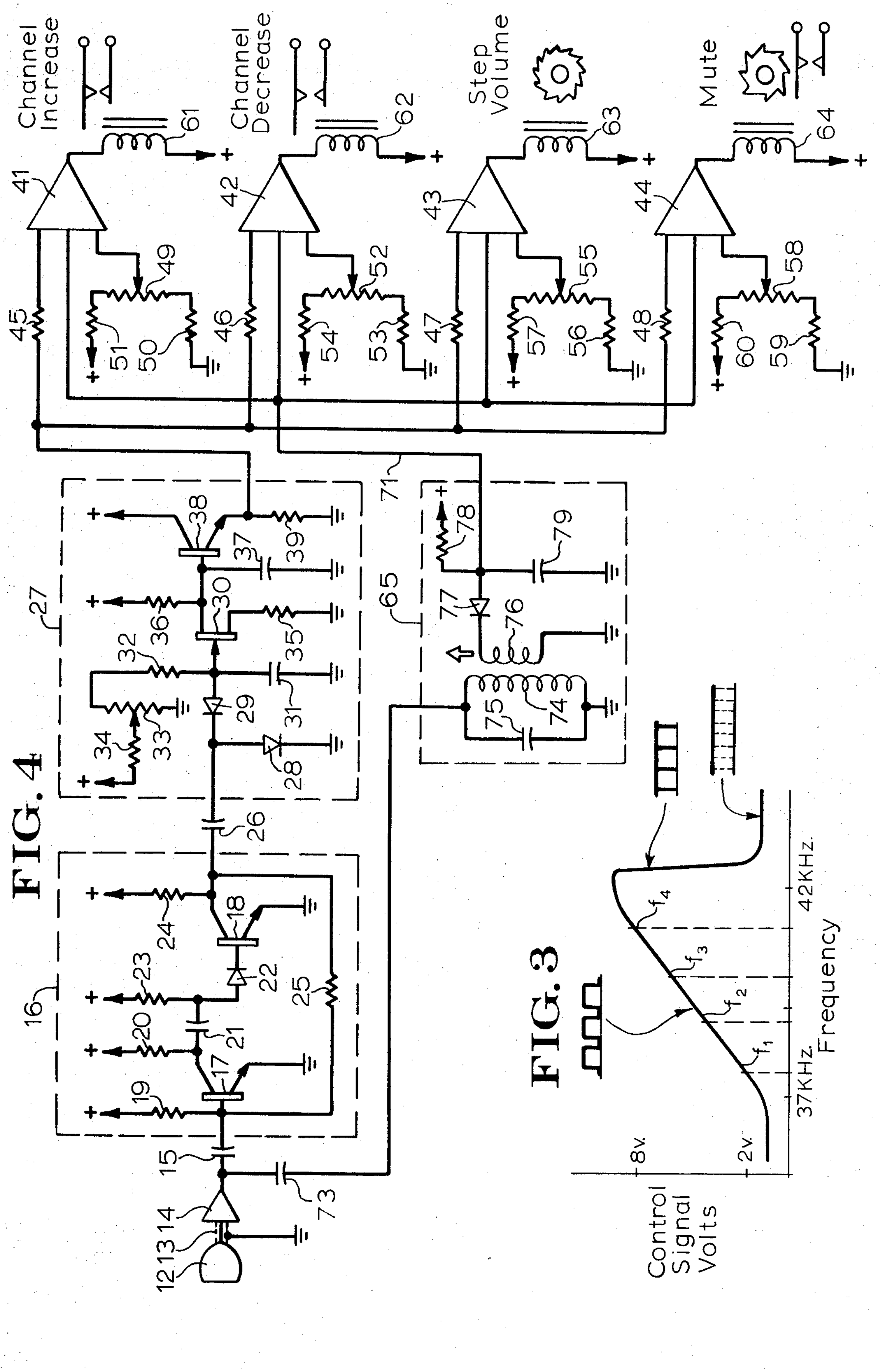
FIG. 3 is a graphical presentation of certain electrical characteristics of the remote control system of FIG. 2 useful in explaining the invention.
FIG. 4 is a schematic diagram, partially in block form, of an alternate embodiment of the ultrasonic remote control system of FIG. 2.

Referring to FIG. 3, a possible alternate embodiment for inhibit stage 65 is shown. In this case a portion of the amplified command signal from amplifier 14 is coupled by a capacitor 73 to one end terminal of a parallel resonant tuned circuit comprising a primary winding 74 and a capacitor 75. The other end terminal of the tuned circuit is grounded and a secondary winding 76 is coupled to winding 74 to sample the resonant current in the tuned circuit. One side of this winding is grounded and the other side is connected to the cathode of a diode 77. The anode of diode 77 is connected directly to inhibit control line 71, to the receiver B+ source by a resistor 78, and to ground by a capacitor 79.

In operation, a received ultrasonic signal excites a resonant current in the tuned circuit comprising winding 74 and capacitor 75. The resonant current is sampled by winding 76 and applied to diode 77, wherein it is rectified to develop a negative dc control voltage across capacitor 79. This has the effect of forcing inhibit control line 71 less positive, notwithstanding the positive bias provided by resistor 78. Since control line 71 is coupled to the gate terminals of each of voltage comparators 41–44, and these devices are inhibited only by a positive input, the voltage comparators are effectively disabled except during receipt of an ultrasonic command signal. The time delay provided by capacitor 79 is sufficient to prevent the various control functions from being erratically actuated as the voltage on control line 40 progressively varies in response to initial receipt of the command signal.

Thus, an economical solid state ultrasonic remote control system receiver has been shown which utilizes no tuned circuits and makes maximum use of state-of-the-art integrated circuitry. This results in a savings in component cost, and an improvement in operational reliability and ease of manufacture through the obviation of difficult time-consuming tuning adjustments. Furthermore, since no tuning circuits are involved, the receiver is substantially immune to the humidity and temperature variation problems which often plague tuned circuits at ultrasonic frequencies. While the invention has been shown in the embodiment of an ultrasonic system, it will be appreciated that it would also find utility in other types of systems such as radio-frequency or sonic systems, where a frequency or pulse repetition rate is relied upon to convey control function information.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A remote control system for initiating a control function in an apparatus from a remote location, comprising:

a remotely located transmitter for generating a wave signal at a predetermined discrete frequency;

receiving means, for intercepting said wave signal, comprising a multivibrator for generating constant-amplitude pulses of uniform predetermined duration at a repetition rate corresponding to the frequency of said wave signal, and a digital-to-analog converter for developing a control signal from said pulses having a predetermined voltage level during reception of wave signals at said predetermined frequency;

control signal recognition means for producing a control effect only when said control signal is at said predetermined voltage level; and utilization means responsive to said control effect for performing said control function during reception of wave signals at said predetermined frequency.

2. A remote control system as described in claim 1 wherein said control signal developed by said receiving means has a nominal voltage level in the absence of an intercepted wave signal and is progressively variable upon initial receipt of an intercepted wave signal, and wherein are further provided inhibiting means for preventing said control signal recognition means from producing a control effect while said control signal is progressively variable.

3. A remote control system as described in claim 1 wherein said control signal recognition means comprise a source of reference potential at said predetermined voltage level, and voltage comparator means for comparing said control voltage with said reference voltage level and developing said control effect when said voltage levels agree.

4. A remote control system as described in claim 3 wherein said wave signal lies within a frequency band having a predetermined upper limit and wherein said multivibrator is a monostable multivibrator producing pulses of uniform predetermined duration such that above said upper frequency limit said pulses overlap to present a constant non-pulsating signal to said digital-to-analog converter.

5. A remote control system as described in claim 4 wherein said control signal recognition means respond only to control signals within a predetermined voltage range, and wherein said digital-to-analog converter develops a control signal outside said range in response to a constant non-pulsating signal from said monostable multivibrator.

6. A remote control system as described in claim 5 wherein the control signal developed by said digital-to-analog converter:

progressively assumes a predetermined voltage level below said predetermined voltage range in the absence of pulses from said multivibrator;

increases within said predetermined range with increases in said pulse repetition rate; and rapidly falls below said range in response to said constant non-pulsating signal.

7. A remote control system as described in claim 6 wherein said wave signal is an ultrasonic pressure wave.

8. A remote control system for performing a plurality of control functions in a television receiver or the like from a remote location, comprising:

a remotely located transmitter for generating a wave signal at one of a plurality of discrete frequencies each of which corresponds to an assigned one of said control functions;

receiving means for intercepting and converting said wave signals to a series of pulses of predetermined uniform width and amplitude, and having a repetition rate corresponding to the frequency of said intercepted wave signals;

means for developing a control signal, having a voltage level representative of the repetition rate of said constant-amplitude, constant-width pulses;

at least one control signal recognition means including a voltage comparator for producing a control effect when said control signal is at a predetermined voltage level; and utilization means for performing an assigned one of said control functions in response to said control effect.

9. A remote control system as described in claim 8 wherein the voltage level of said control signal developed by said receiving means has a nominal voltage level in the absence of an intercepted wave signal and is progressively variable upon initial receipt of an intercepted wave signal, and wherein are further provided inhibiting means for preventing said first and second control signal recognition means from producing a control effect while said control signal is progressively variable.

* * * * *